(12) United States Patent
Park et al.

(10) Patent No.: US 12,080,691 B2
(45) Date of Patent: Sep. 3, 2024

(54) SEMICONDUCTOR DEVICES

(71) Applicant: SAMSUNG ELECTRONICS CO., LTD., Suwon-si (KR)

(72) Inventors: Sungwoo Park, Seongnam-si (KR); Heonwoo Kim, Cheonan-si (KR); Sangcheon Park, Hwaseong-si (KR); Wonil Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 402 days.

(21) Appl. No.: 17/585,122

(22) Filed: Jan. 26, 2022

(65) Prior Publication Data

US 2022/0392878 A1 Dec. 8, 2022

(30) Foreign Application Priority Data

Jun. 2, 2021 (KR) .................. 10-2021-0071296

(51) Int. Cl.
*H01L 25/10* (2006.01)
*H01L 23/00* (2006.01)
*H01L 23/538* (2006.01)
*H01L 25/065* (2023.01)

(52) U.S. Cl.
CPC ........ *H01L 25/105* (2013.01); *H01L 23/5384* (2013.01); *H01L 23/5386* (2013.01); *H01L 24/16* (2013.01); *H01L 24/32* (2013.01); *H01L 24/73* (2013.01); *H01L 25/0657* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2225/06513* (2013.01); *H01L 2225/06544* (2013.01); *H01L 2924/37001* (2013.01)

(58) Field of Classification Search
CPC . H01L 23/5384; H01L 23/5386; H01L 24/16; H01L 24/32; H01L 24/73; H01L 25/105; H01L 25/0657; H01L 2224/16227; H01L 2224/16145; H01L 2224/32145; H01L 2224/73204; H01L 2224/32225; H01L 2225/06513; H01L 2225/06544; H10B 80/00
USPC ................................................ 257/692, 777
See application file for complete search history.

(56) References Cited

U.S. PATENT DOCUMENTS

| 7,589,396 B2 | 9/2009 | Zandman et al. |
| 8,014,154 B2 | 9/2011 | Lee |
| 9,209,140 B2 | 12/2015 | Chen et al. |

(Continued)

FOREIGN PATENT DOCUMENTS

| KR | 10-2007-0004285 A | 1/2007 |
| KR | 10-1119305 B1 | 3/2012 |

(Continued)

*Primary Examiner* — Jasmine J Clark
(74) *Attorney, Agent, or Firm* — Fish & Richardson P.C.

(57) ABSTRACT

A semiconductor device including an interposer including a central region and an edge region entirely surrounding the central region, wherein the interposer includes a wiring structure disposed in the first region and a metal structure disposed continuously within the entirety of the second region, a first semiconductor chip mounted in the central region and connected to the wiring structure, and a second semiconductor chip mounted in the central region adjacent to the first semiconductor chip and connected to the second wiring structure.

20 Claims, 14 Drawing Sheets

(56) References Cited

U.S. PATENT DOCUMENTS

| | | |
|---|---|---|
| 9,899,305 B1 | 2/2018 | Yeh et al. |
| 10,468,318 B2 | 11/2019 | Ahmad et al. |
| 10,692,848 B2 | 6/2020 | Chuang et al. |
| 2007/0002545 A1 | 1/2007 | Cho et al. |
| 2016/0133605 A1* | 5/2016 | Bae .................... H01L 23/5385 |
| | | 257/783 |
| 2020/0006252 A1 | 1/2020 | Yu et al. |
| 2020/0203280 A1 | 6/2020 | Wang et al. |
| 2022/0199577 A1* | 6/2022 | Park .................... H01L 25/0652 |

FOREIGN PATENT DOCUMENTS

| | | | |
|---|---|---|---|
| KR | 10-2019-0052540 A | 5/2019 | |
| KR | 10-2020-0003706 A | 1/2020 | |

* cited by examiner

SEMICONDUCTOR DEVICES

CROSS-REFERENCE TO RELATED APPLICATION

This application claims priority under 35 U.S.C. § 119 to Korean Patent Application No. 10-2021-0071296 filed on Jun. 2, 2021 in the Korean Intellectual Property Office, the subject matter of which is hereby incorporated by reference in its entirety.

BACKGROUND

Embodiments of the inventive concept relate to semiconductor devices.

The so-called system in package (SIP) generally includes a single package containing multiple semiconductor chips. In order to form the very fine wirings used to variously connect the semiconductor chips within the package, an interposer may be used. In this regard, the interposer may include one or more through silicon via(s) (TSV).

However, complexity of SIPs may result in design and/or fabrication errors negatively impacting overall performance and reliability.

SUMMARY

Embodiments of the inventive concept provide semiconductor devices exhibiting improved reliability.

According to an aspect of the inventive concept, a semiconductor device includes; an interposer extending in a first horizontal direction and a second horizontal direction, wherein the interposer includes a base substrate including a first surface and a second surface opposing the first surface, and a circuit layer disposed on the second surface and including a first region and a second region surrounding the first region, and the circuit layer includes an insulating member, a wiring structure disposed in the first region of the circuit layer within the insulating member, and a metal structure disposed in the second region of the circuit layer within the insulating member, a first semiconductor chip centrally mounted on the interposer and connected to the wiring structure, and at least one second semiconductor chip mounted on the interposer adjacent to the first semiconductor chip and connected to the wiring structure.

According to an aspect of the inventive concept, a semiconductor device includes; an interposer including a central region and an edge region entirely surrounding the central region, wherein the interposer includes a wiring structure disposed in the first region and a metal structure disposed continuously within the entirety of the second region, a first semiconductor chip mounted in the central region and connected to the wiring structure, and a second semiconductor chip mounted in the central region adjacent to the first semiconductor chip and connected to the wiring structure, wherein the wiring structure and the metal structure are electrically separate and are formed from the same material.

According to an aspect of the inventive concept, a semiconductor device includes; a package substrate including a substrate body having an upper surface and a lower surface, upper pads disposed on the upper surface, lower pads disposed on the lower surface, first connection bumps respectively disposed the lower pads, and a first wiring structure connecting at least one upper pad with at least one lower pad, an interposer mounted on the package substrate through second connection bumps respectively disposed on the upper pads and including a second wiring structure, a logic chip centrally mounted on the interposer and connected to the second wiring structure, and a memory chip mounted on the interposer adjacent to the logic chip and connected to the second wiring structure, wherein the interposer includes a base substrate, and a circuit layer disposed on base substrate, the interposer further includes a first region and a second region surrounding the first region, and the circuit layer includes an insulating member, the second wiring structure disposed in the first region of the circuit layer within the insulating member, and a metal structure disposed in the second region of the circuit layer within the insulating member.

BRIEF DESCRIPTION OF DRAWINGS

Embodiments of the inventive concept may be better understood upon consideration of the following written description together with the accompanying drawings in which:

FIG. 1 includes FIGS. 1A, 1B, 1C and 1D, wherein

FIG. 4 includes, FIGS. 4A and 4B, wherein

FIG. 8 includes, FIGS. 8A and 8B, wherein

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
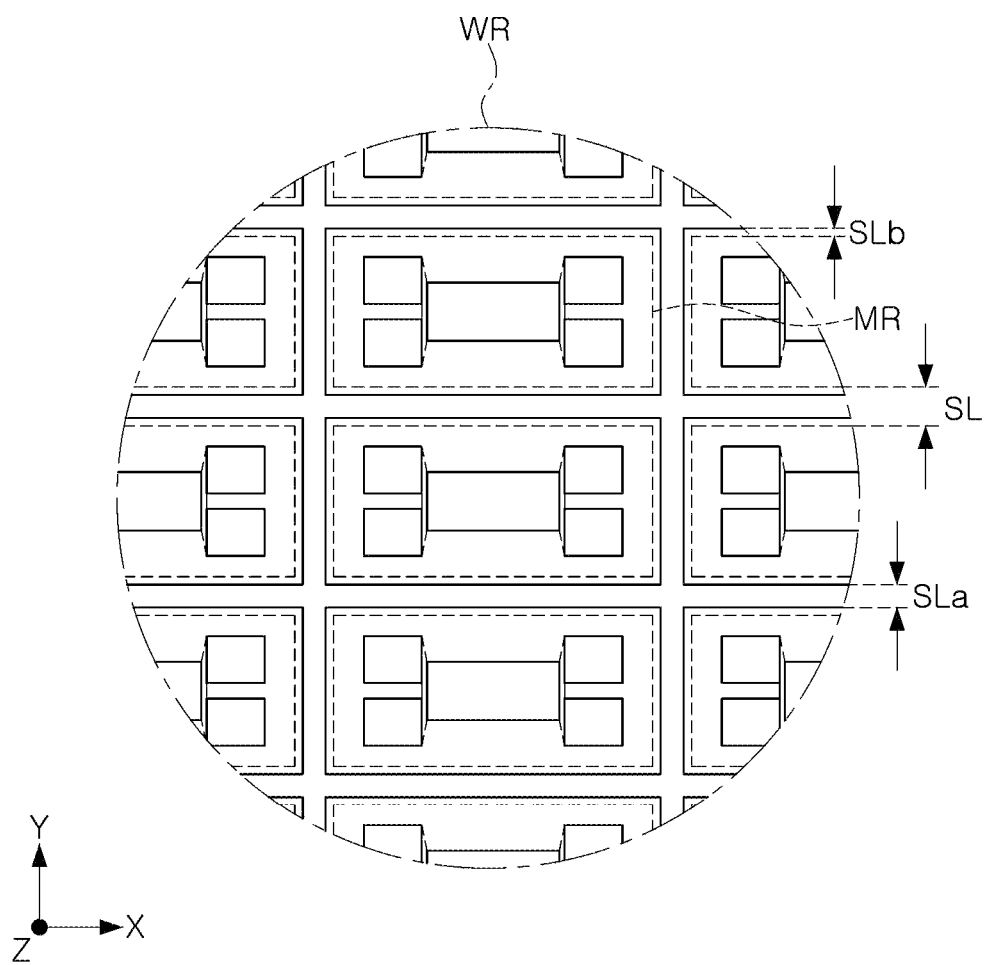
FIG. 1A is a plan view illustrating a wafer on which a semiconductor device according to embodiments of the inventive concept may be manufactured.
Figure 1B:
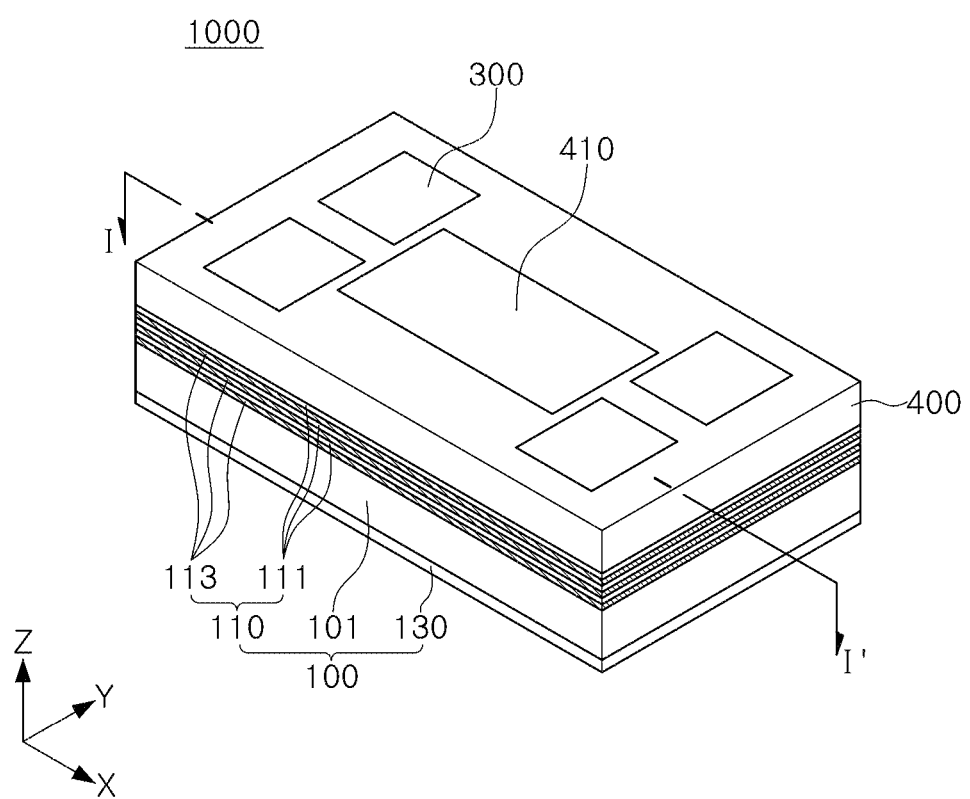
FIG. 1B is a perspective view of the semiconductor device of FIG. 1A.
Figure 1C:
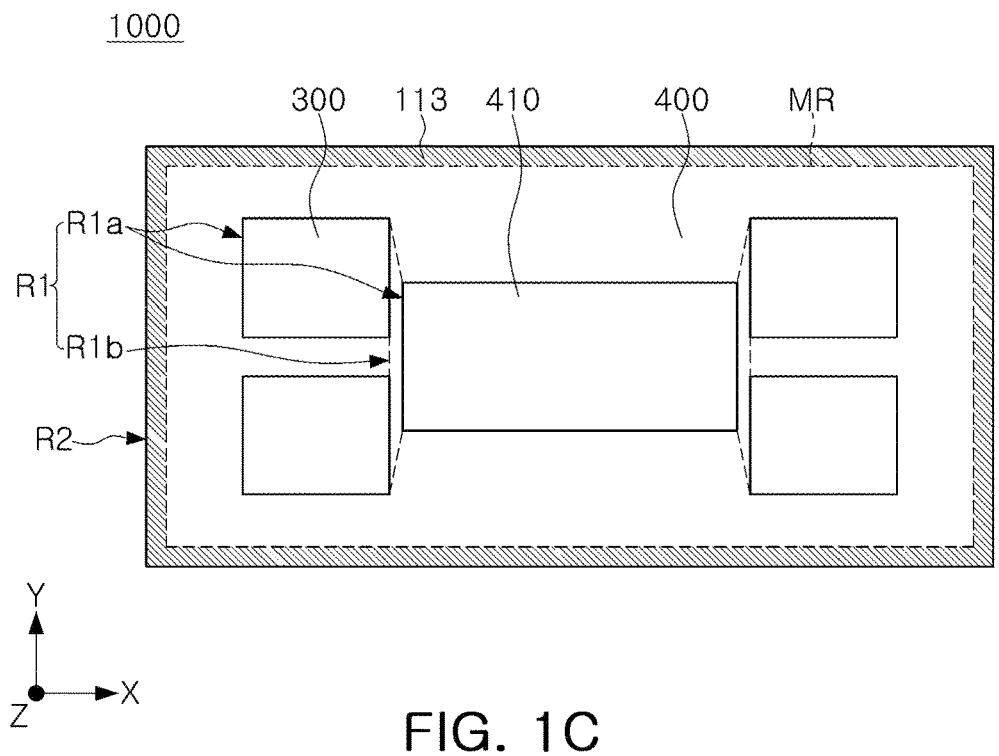
FIG. 1C is a plan view of the semiconductor device of FIG. 1A.
Figure 1D:
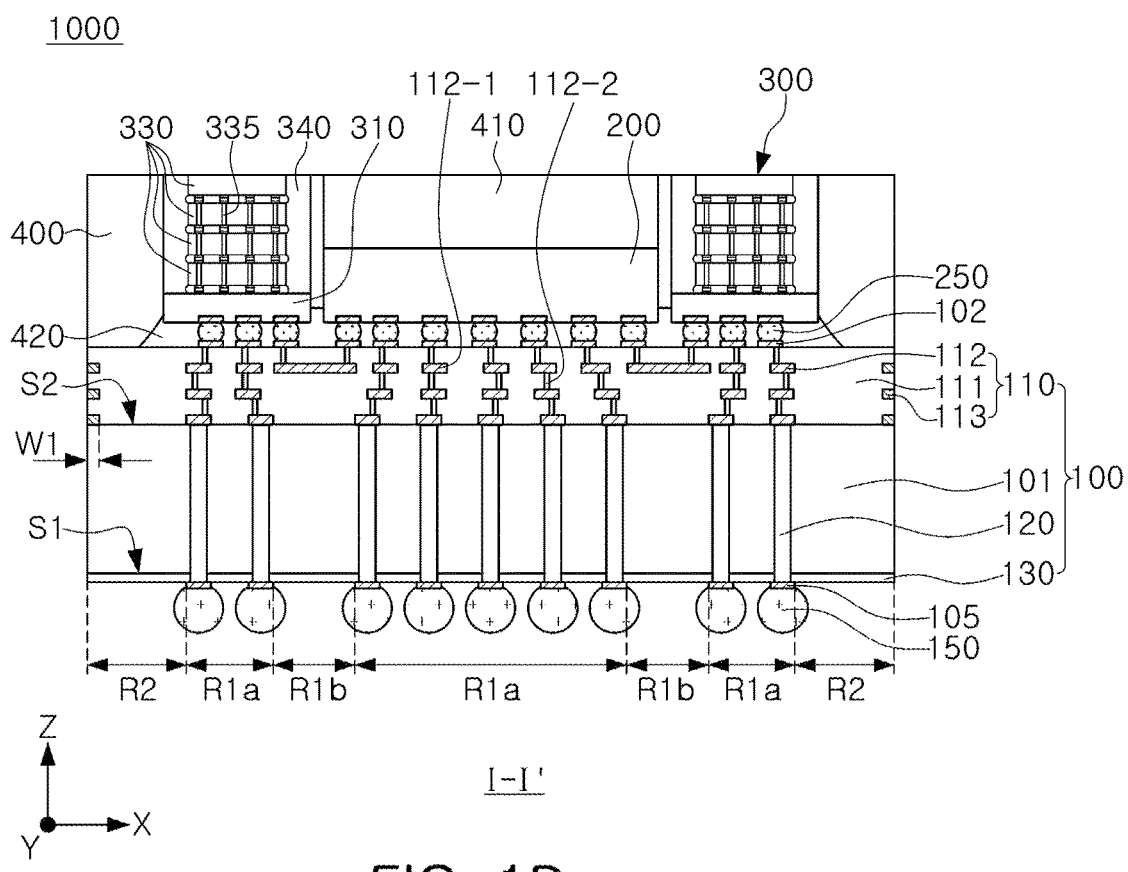
FIG. 1D is a cross-sectional view along line I-I' of FIG. 1B.

Figure (FIG. 1 includes FIG. 1A, FIG. 1B, FIG. 1C, and FIG. 1D, wherein FIG. 1A is a plan (or top-down) view illustrating a waferWR on which semiconductor devices according to embodiments of the inventive concept may be manufactured, FIG. 1B is a perspective view of a semiconductor device 1000, FIG. 1C is a plan view of the semiconductor device 1000, and FIG. 1D is a cross-sectional view taken along line I-I' of FIG. 1B.

Referring to FIG. 1A, the wafer WR for manufacturing the semiconductor devices may include multiple main regions (or chip regions) MR respectively separated by scribe lane regions SL. That is, the main regions MR are laterally spaced apart in a first horizontal direction (e.g., the X direction) and in a second horizontal direction (e.g., the Y direction) by various scribe lane regions SL.

In this regard, upon completion of wafer level fabrication processes, respective semiconductor devices may be separated from the wafer WR (or singulated) by cutting (e.g., sawing) along the scribe lane regions SL.

In some embodiments, each scribe lane region SL may be understood as including a touch region SLa (e.g., an inner region actually sawed by or coming into contact with a saw blade during the sawing process) and a non-touch region SLb (e.g., opposing outer regions bracketing the touch region SLa and not coming into contact with the saw blade during the sawing process). Thus, each non-touch region SLb provides margin for the sawing process, thereby reducing the risk of processing errors. As a result, each semiconductor device 1000 separated from the wafer WR by application of the sawing process may include a main region MR and a non-touch region SLb substantially surrounding the main region MR.

Assuming for purposes of exemplary illustration, the scribe lane region SL may have a width ranging from about 280 μm to about 340 μm, and the saw blade may have a width ranging from about 20 μm to about 40 μm. Hence, the non-touch region SLb—following completion of the sawing process—may have a width ranging from about 125 μm to about 165 μm.

Referring to FIGS. 1B, 1C, and 1D, once separated from the wafer WR by application of the sawing process, the semiconductor device 1000 includes an interposer 100 having lateral dimensions largely defined by a combination of the main region MR and the non-touch region SLb.

In the illustrated example of FIGS. 1B, 1C and 1D, the semiconductor device 1000 may include the interposer 100, a first semiconductor chip 200 (see FIG. 1D) mounted on the interposer 100, and at least one second semiconductor chip 300 mounted on the interposer 100 adjacent to the first semiconductor chip 200. (Of note, more than one first semiconductor chip 100 and/or more than one second semiconductor chip 200 may be included in the semiconductor device 1000, but for the sake of descriptive simplicity these elements may be referred to in the singular). Here, the term "mounted" denotes mechanical assembly and/or electrical connection between respective components. The semiconductor device 1000 may further include a mold layer 400, an adhesive member 410, and an upper underfill resin 420.

The interposer 100 is essentially a support substrate on which the first semiconductor chip 200 and the at least one second semiconductor chip 300 may be mounted. In some embodiments, the interposer 100 may include a base substrate 101, a circuit layer 110, a through-via 120, and a protective layer 130.

The base substrate 101 may be disposed on a package substrate 10 (see FIG. 9), and may have a first (or lower) surface S1 facing the package substrate 10 and an opposing second (or upper) surface S2 opposite to the first surface S1. The base substrate 101 may be a semiconductor wafer. In some embodiments, the base substrate may have a substantially rectangular shape in which sides extending in the first horizontal direction (the X direction) are greater than sides extending in the second horizontal direction (the Y direction). The base substrate 101 may include one or more semiconductor(s) such as silicon (Si), germanium (Ge), silicon carbide (SiC), gallium arsenide (GaAs), indium arsenide (InAs), indium phosphide (InP), etc. A lower surface (or rear surface) of the base substrate 101 may be covered with an insulating film formed of at least one of silicon oxide and silicon nitride.

The circuit layer 110 may be disposed on (or contact) a second surface S2 of the base substrate 101. However, the disposition, layout and/or shape of the circuit layer 110 may vary by design may in some embodiments may extend to the first surface S1 of the base substrate 101. In some embodiments, the circuit layer 110 may include an insulating member 111, a second wiring structure 112, and a metal structure 113.

The insulating member 111 may be an insulating layer covering the second wiring structure 112. The insulating member 111 may include silicon oxide and/or silicon nitride.

The second wiring structure 112 may be disposed in the insulating member 111. The second wiring structure 112 may include a number of wiring patterns 112-1 vertically spaced apart (e.g., in the Z direction extending substantially perpendicular to the second surface S2 of the base substrate 101). Multiple vias 112-2 may be used to variously connect the wiring patterns 112-1. Each of the wiring patterns 112-1 may one of a power wiring, a ground wiring or a signal wiring. The number (e.g., 2, 3, 4 or 5) of vertically stacked layers associated with the wiring patterns 112-1 may vary by design.

A thickness of each one of the wiring patterns 112-1 may range from about 1 μm to about 2 μm.

The vias 112-2 may be variously used to interconnect the wiring patterns 112-1 and/or connect one or more of wiring patterns 112-1 with one or more upper pads 102. The second wiring structure 112 may electrically and/or physically connect a through-via 120 to the first semiconductor chip 200 and/or the second semiconductor chip 300.

Figure 9:
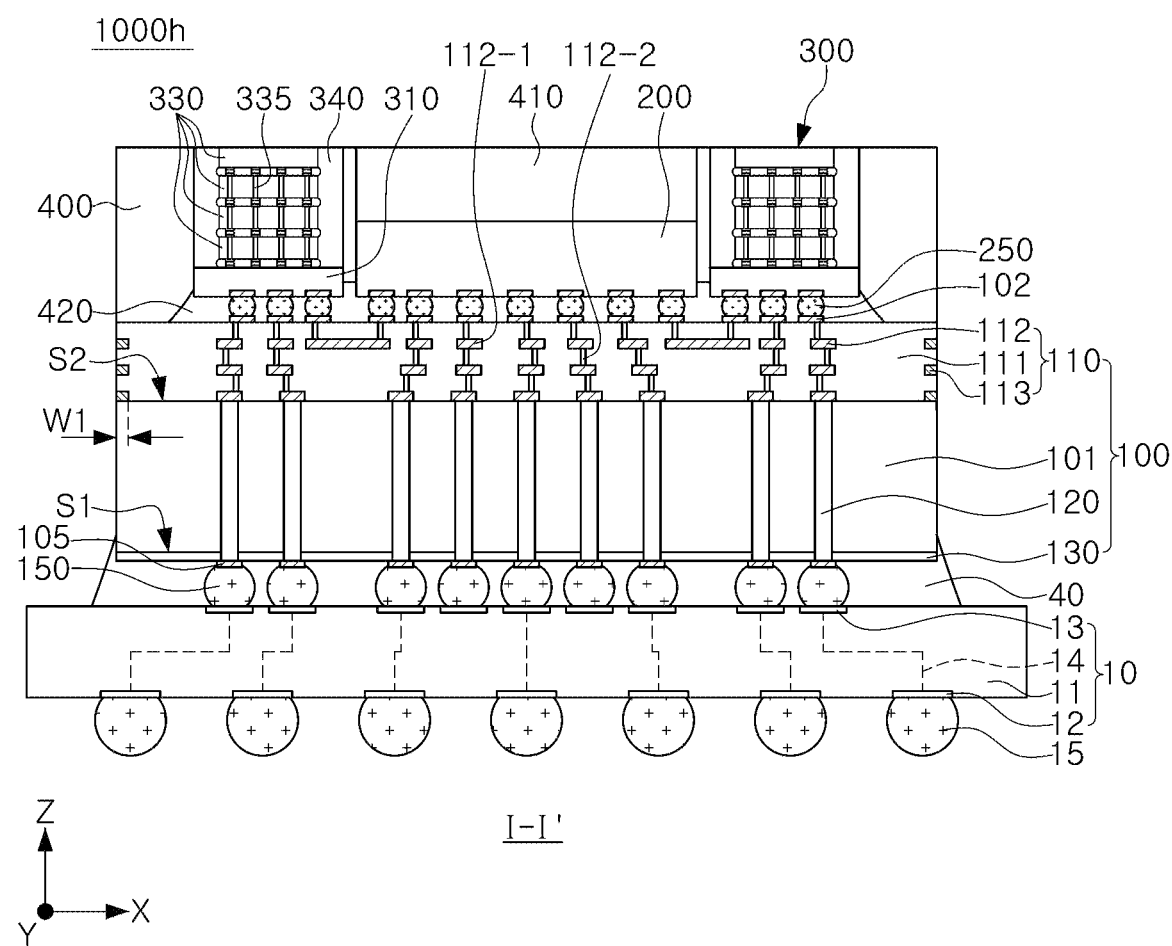
FIGS. 9 and 10 are respective cross-sectional view illustrating semiconductor devices according to embodiments of the inventive concept.

Referring to FIG. 9, the second wiring structure 112 may be electrically connected to the first wiring structure 14 of the package substrate 10 through the through-via 120. Accordingly, the second wiring structure 112 may electrically connect the first semiconductor chip 200 and the second semiconductor chip 300 to the first wiring structure 14 of the package substrate 10.

The second wiring structure 112 may include at least one conductive material, such as for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The metal structure 113 may include a number metal patterns respectively disposed, and vertically spaced apart, within the insulating member 111. For example, the metal patterns may be respectively disposed at same level(s) as the wiring patterns 112-1.

That is, the metal patterns may be formed by the same process as the wiring patterns 112-1. Accordingly, each of the metal patterns may have a same thickness as a corresponding one of the wiring patterns 112-1. In some embodiments, the thickness of each of the metal patterns may range from about 1 μm to about 2 μm. In some embodiments, the metal structure 113 may not include vias interconnecting the metal patterns.

The metal structure 113 may include at least one conductive material, such as for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). However, the composition of the second wiring structure 112 is not limited thereto. That is, in some embodiments, the metal structure 113 may be formed of the same material as the second wiring structure 112, but is not necessarily limited thereto. The metal structure 113 may be electrically isolated from the second wiring structure 112. Accordingly, the metal structure 113 may be electrically isolated from the first wiring structure 14, the first semiconductor chip 200 and the second semiconductor chip 300. As the metal structure 113 may be disposed in the interposer 100, an overall coefficient of thermal expansion (CTE) for the interposer 100 may increase. Accordingly, a reliability problem arising in relation to a difference in the CTE with a lower region of the interposer 100 may be avoided. Additionally, since the metal structure 113 is disposed in the interposer 100, it is possible to suppress crack generation.

The circuit layer 110 of the interposer 100 may have a first region R1 including the second wiring structure 112 and a second region R2 different from the first region RE In some embodiments, the second region R2 substantially surround the first region RE Here, the first region R1 may include a non-signal region R1a including one portion of the second wiring structure 112 connecting each of the first semiconductor chip 200 and the second semiconductor chip 300 to the through-via 120, and a signal region R1b including another portion of the second wiring structure 112 connecting the first semiconductor chip 200 and the second semiconductor chip 300. That is, the non-signal region R1a may include regions below the first semiconductor chip 200 and below the second semiconductor chip 300, whereas the signal region R1b may be a region including the second wiring structure 112 in which a signal pattern between the first semiconductor chip 200 and the second semiconductor chip 300 is disposed. That is, the signal region R1b may correspond to a lower portion of the region between the first semiconductor chip 200 and the second semiconductor chip 300. A portion of the wiring patterns 112-1 of the signal region R1b may serve as a ground layer, and a remaining portion thereof may serve as a signal layer. In some embodiments, the signal region R1b may have a trapezoidal shape (assuming the plan perspective of FIG. 1A as a viewing angle), but is not limited thereto. More generically, the signal region R1b may be any region of the interposer 100 including a portion of the second wiring structure 112 communicating signals between the first semiconductor chip 200 and the second semiconductor chip 300.

The second region R2 may be a region other than (or excluding) the first region R1. Referring to FIG. 1A, in some embodiments, the second region R2 may be a region including the non-touch region SLb, and may be referred to as a dummy region.

The metal structure 113 may be disposed in the second region R2. In some embodiments, the second region R2 may have an edge region disposed along an edge of the base substrate 101. That is, the metal structure 113 may be disposed in an edge region of the second region R2. Referring to FIG. 1A, the edge region may be a region including the non-touch region SLb. Accordingly, the edge region may have a width that ranges from about 125 μm to about 165 μm. That is, when viewed in plan, the metal structure 113 may be understood as descending in its arrangement towards an inner portion of the interposer 100, while at the same time extending substantially along the outer edge portions of the interposer 100.

In some embodiments, the metal structure 113 may have a first width W1 and may be disposed continuously along edge portions of the interposer 100. Here, as shown in FIG. 1D, the first width W1 may horizontally extend from an outer edge of the interposer 100 towards a center portion of the interposer 100. In some embodiments, the first width W1 may define a width of an edge region of the interposer 100.

However, the disposition of the metal structure 113 is not necessarily limited to the circuit layer 110 and may be disposed in another region of the interposer 100. Accordingly, the above-described first region R1 and second region R2 may be understood as regions of the interposer 100 rather than regions of the circuit layer 110.

One or more through-vias 120 may be respective a through silicon vias (TSV) completely penetrating through the height (e.g., measured in the vertical (or Z) direction) of the base substrate 101. Accordingly, each through-via 120 may provide an electrical path connecting (e.g.,) an upper pad 102 disposed on the upper surface of the interposer 100 with a lower pad 105 disposed on the lower surface of the interposer 100. Alternately or additionally, each through-via 120 may electrically connect a first wiring structure 14 of the package substrate 10 with a second wiring structure 112 of the interposer 100.

Each through-via 120 may include a conductive plug and a barrier film surrounding the conductive plug. Here, the conductive plug may include at least one of, for example, tungsten (W), titanium (Ti), aluminum (Al) and copper (Cu). The conductive plug may be formed using a plating process, a Physical Vapor Deposition (PVD) process and/or a Chemical Vapor Deposition (CVD) process. The barrier film may include an insulating barrier film and/or a conductive barrier film. The insulating barrier film may include at least one of an oxide film, a nitride film, a carbide film, and a polymer. The conductive barrier film may be disposed between the insulating barrier film and the conductive plug. The conductive barrier layer may include at least one of, for example, tungsten nitride (WN), titanium nitride (TiN) and tantalum nitride (TaN). The barrier film may be formed using a PVD process and/or a CVD process.

The protective layer 130 may be formed on the first surface S1 of the base substrate 101. In this regard, the protective layer 130 may cover portions of the through-vias 120 exposed after a portion of the base substrate 101 has been removed by a Chemical Mechanical Polishing (CMP) process, or the like. The protective layer 130 may include an insulating layer such as a silicon oxide film, a silicon nitride film, a silicon oxynitride film and/or a polymer (e.g., Polyimide (PI)).

In some embodiments, the protective layer 130 may be selectively formed on only portions of the first surface S1 and/or the second surface S2. In some embodiments, the protective layer 130 may be formed on an upper surface of the circuit layer 110.

The lower pads 105 may be partially disposed on the protective layer 130 to contact exposed, lower surfaces of the through-via 120. Thus, each lower pad 105 may be disposed on the first surface S1 of the base substrate 101. The lower pad 105 may contact the protective layer 130 on the first surface S1 of the base substrate 101. The lower pad 105 may also contact (or connect) a second connection bump 150. The lower pads 105 may be formed of at least one of, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

The upper pads 102 may be disposed on the second surface S2 of the base substrate 101. Each upper pad 102 may be disposed in contact with exposed upper surfaces of the circuit layer 110. The upper pad 102 may contact (or connect) a third connection bump 250. The upper pad 102 may include one or more conductive materials, such as a metal.

The first semiconductor chip 200 may be disposed on the interposer 100 using connection pads. The connection pads may include signal pad(s) connecting the second semiconductor chip 300, ground pad(s), and/or power pad(s). The first semiconductor chip 200 may include, for example, a logic chip such as an application-specific IC (ASIC), a central processor (CPU), a graphics processor (GPU), a field programmable gate array (FPGA), a digital signal processor, a cryptographic processor, a microprocessor, a microcontroller, an analog-digital converter.

The second semiconductor chip 300 may be disposed laterally adjacent to the first semiconductor chip 200, and may be a memory device including at least one memory chip. In addition, the second memory chip 300 may also be connected through signal pad(s), ground pad(s) and/or power pads variously connected to wiring associated with the interposer 100, for example.

In some embodiments, the second semiconductor chip 300 may include a vertical stack of chips including a base chip 310 and memory chips 330. Here, the number (e.g., 2, 3, 4 or 5) of memory chips 330 stacked on the base chip 310 may vary by design. The base chip 310 may include a body of one or more semiconductor material(s), such as silicon (Si), and may further include TSVs penetrating the body. Alternately, and the body of the base chip 310 may include a Printed Circuit Board (PCB) or a glass substrate. The base chip 310 may be a buffer die configured to receive control signal(s), data signal(s), address signal(s), power/ground signal(s) associated with the operation of the memory chips 330. These control signal(s), data signal(s), address signal(s), power/ground signal(s) may be externally provided. The base chip 310 may also receive control signal(s), data signal(s) and address signal(s) from the memory chips 330.

The vertically stacked memory chips 330 may be respectively interconnected through TSVs 335 penetrating through various portions of various memory chips 330. The memory chips 330 may include one or more volatile memory devices such as a Dynamic Random Access Memory (RAM) (DRAM) or a static RAM (SRAM), as well as one or more non-volatile memory devices such as a Phase-Change RAM (PRAM), a magnetic RAM (MRAM), a resistance RAM (RRAM), a flash memory device, etc.

The memory chips 330 may be respectively configured to store and/or output data in response to one or more signals received from the base chip 310. A conductive bump and an insulating film surrounding the conductive bump may be disposed between vertically adjacent one of the memory chips 330.

In some embodiments, the first semiconductor chips and the based chip 310 may be surrounded (partially or completely) by a molding member 340. Here, the molding member 340 may include one or more insulating resin(s), such as for example, prepreg, Ajinomoto build-up film (ABF), FR-4, bismaleimide triazine (BT), an epoxy molding compound (EMC), etc.

In some embodiments, the second semiconductor chip 300 may be a high-bandwidth memory device (HBM) including vertically stacked memory chips, but this is just one example. Alternately, the second semiconductor chip 300 may a hybrid memory cubic (HMC). In other embodiments, the second semiconductor chip 300 may include one or more DRAM(s), SRAM(s), PRAM(s), MRAM(s), RRAM(s), flash memory device(s), etc.

The mold layer 400 may be a layer covering the first semiconductor chip 200 and the second semiconductor chip 300 as mounted on the interposer 100. The mold layer 400 may be a layer covering the upper pads 102 and the third connection bumps 250.

In some embodiments, an upper underfill resin 420 may be introduced between the interposer 100 and the first semiconductor chip 200 and/or between the interposer 100 and the second semiconductor chip 300.

An adhesive member 410 may be disposed on the first semiconductor chip 200, wherein the mold layer 400 may not cover an upper surface of the adhesive member 410. The adhesive member 410 may include one or more adhesive material(s) and may in some embodiments be configured to adjust a height difference between the first semiconductor chip 200 and the second semiconductor chip 300. The adhesive member 410 may include, for example, a thermally conductive adhesive tape, thermally conductive grease, thermally conductive adhesive, etc.

Figure 2:
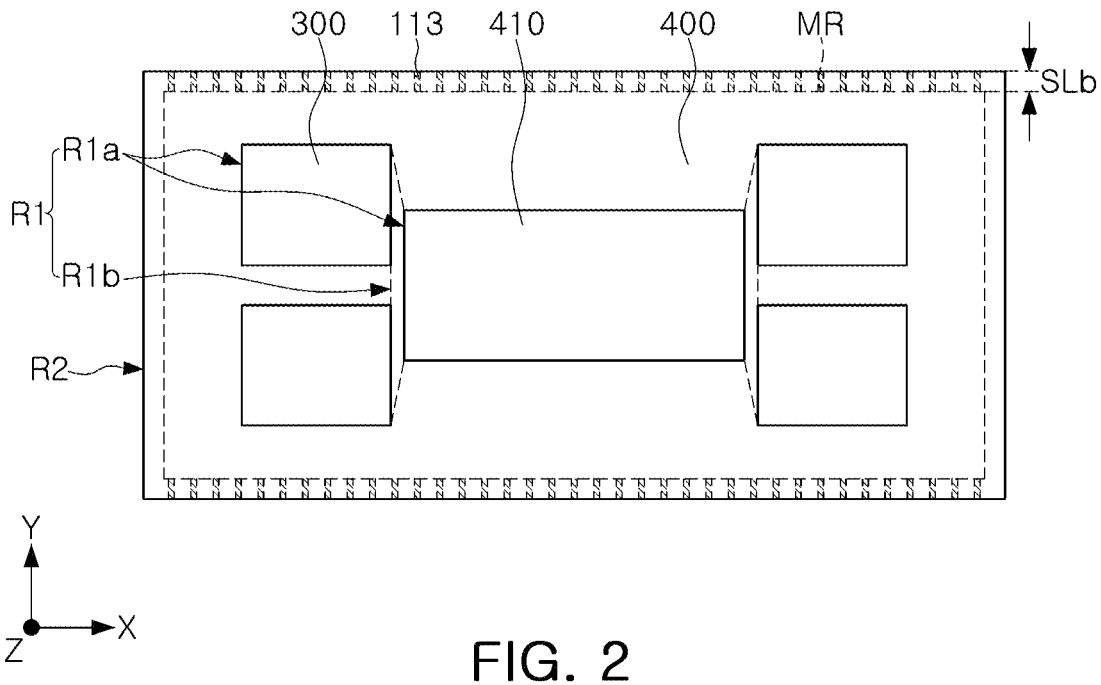
FIGS. 2 and 3 are respective plan views additional semiconductor devices according to embodiments of the inventive concept.

FIG. 2 is a plan view illustrating a semiconductor device 1000a according to an embodiment of the inventive concept.

Referring to FIG. 2, the semiconductor device 1000a may be substantially similar to the semiconductor 1000 of FIG. 1, except for the particular structure of a metal structure 113.

In the semiconductor device 1000a, the metal structure 113 may include a number of relatively short, metal segments being regularly spaced apart in the first horizontal (or X) direction, and horizontally extending in the second horizontal (or Y) direction in only the second region R2 of the circuit layer 110 from opposing edge regions of the interposer 100. In this regard, the term "short" is a relative attribute drawn in relation to the extent of the second region of the circuit layer 110 as compared with a combination of the first region and the second region of the circuit layer 110. Alternately, the short line patterns may be irregularly spaced apart. Referring to FIGS. 1A and 2, the metal structure 113 may be disposed in selected edge regions, wherein each edge region includes a non-touch region SLb.

Figure 3:
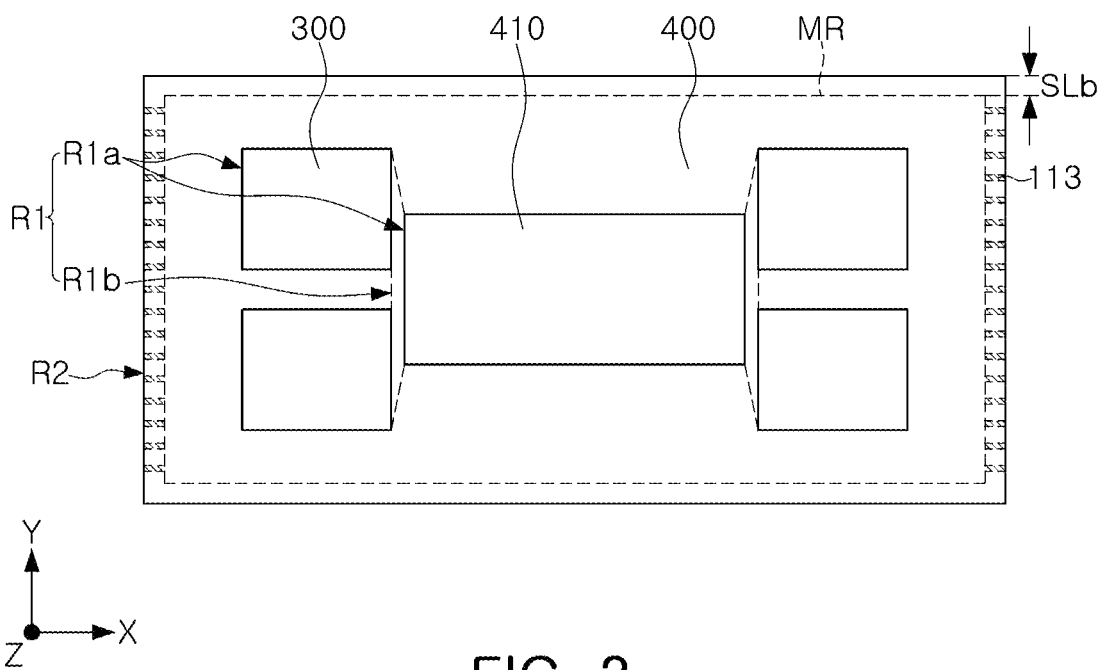

FIG. 3 is a plan view illustrating a semiconductor device 1000b according to an embodiment of the inventive concept.

Referring to FIG. 3, the semiconductor device 1000b may be substantially similar to the semiconductor 1000 of FIG. 1, except for the particular structure of a metal structure 113.

In the semiconductor device 1000b, the metal structure 113 may include a number of relatively short metal segments being regularly spaced apart in the second horizontal (or Y) direction, and horizontally extending in the first horizontal (or X) direction only in the second region R2 of the circuit layer 110 from opposing edge regions of the interposer 100. Alternately, the short line patterns may be irregularly spaced apart. Referring to FIGS. 1A and 3, the metal structure 113 may be disposed in selected edge regions, wherein each edge region includes a non-touch region SLb.

Figure 4A:
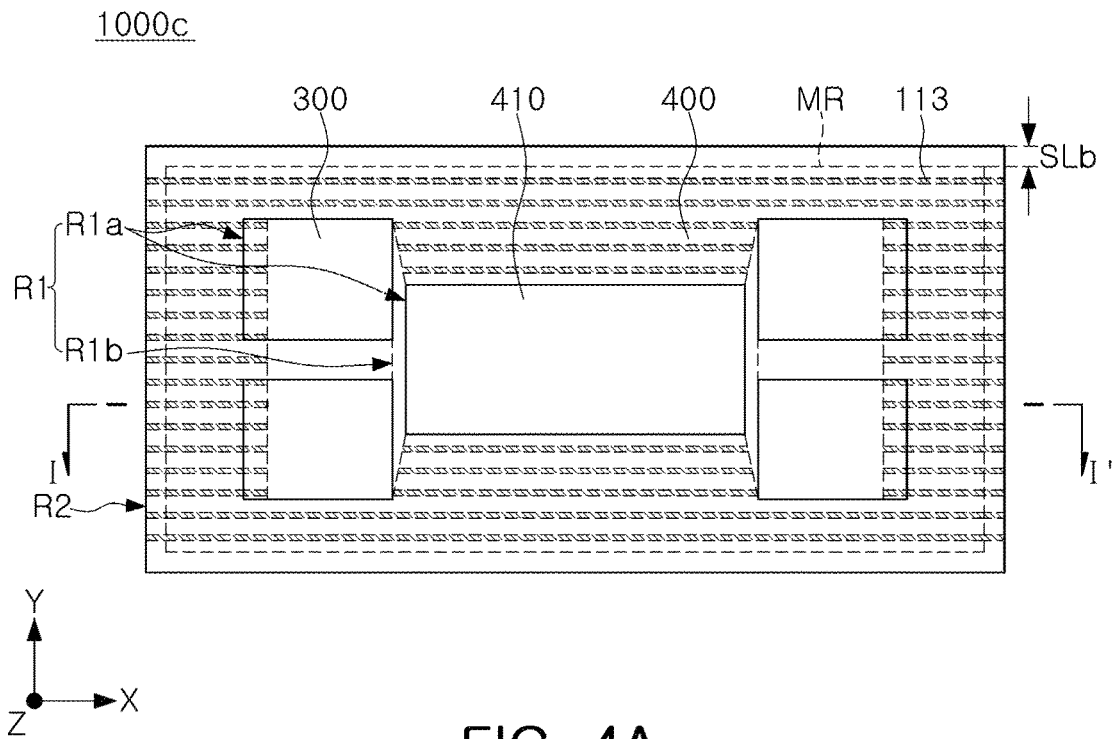
FIG. 4A is a plan view illustrating a semiconductor device according to embodiments of the inventive concept.
Figure 4B:
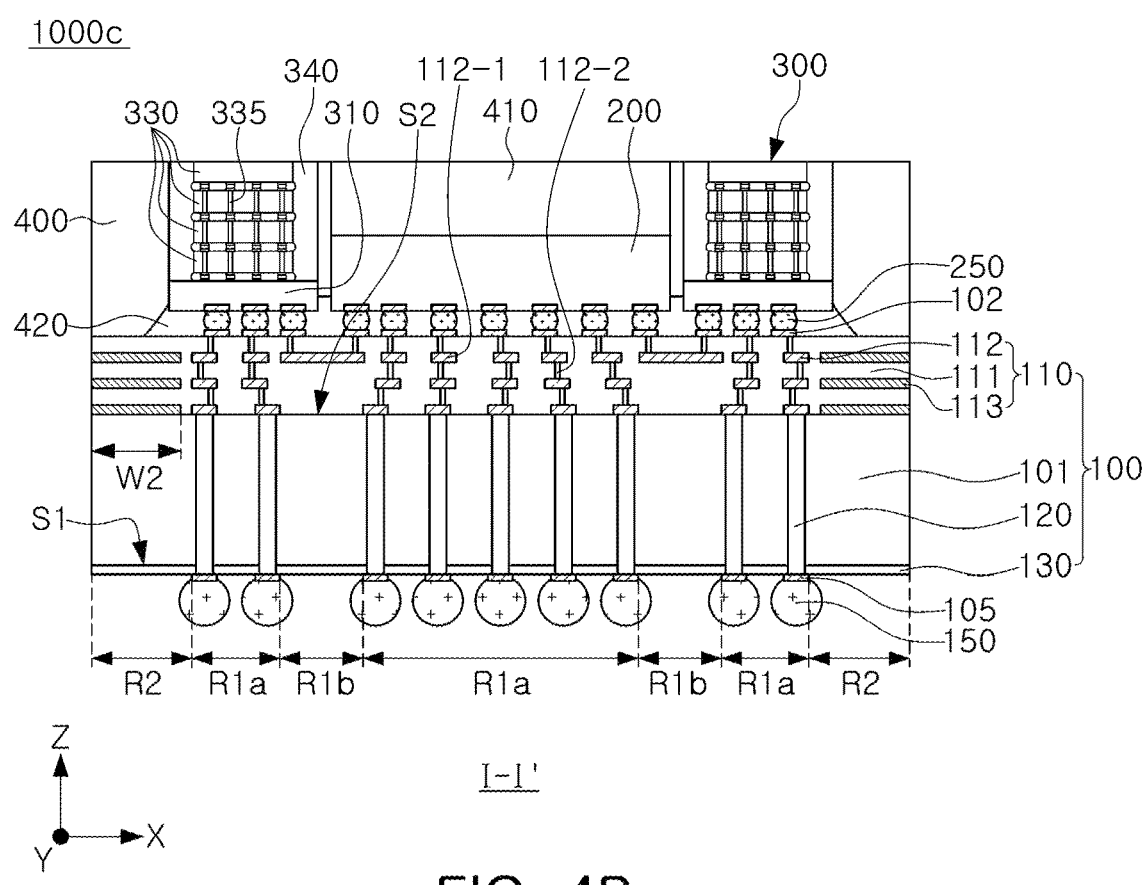
FIG. 4B is a cross-sectional view taken along line I-I' of FIG. 4A.

FIG. 4 includes FIG. 4A and FIG. 4B, wherein FIG. 4A is a plan view illustrating a semiconductor device 1000c according to an embodiment of the inventive concept, and FIG. 4B is a cross-sectional view of the semiconductor device 1000c taken along the line I-I' of FIG. 4A.

Referring to FIG. 4, the semiconductor device 1000c may be substantially similar to the semiconductor 1000 of FIG. 1, except for the particular structure of a metal structure 113.

In the semiconductor device 1000c, the metal structure 113 may include a first metal line pattern including a number of relatively long metal lines regularly spaced apart in the second horizontal (or Y) direction and horizontally extending in the first horizontal (or X) direction across second region R2 into the first region R1 of the circuit layer 110 from opposing edge regions of the interposer 100. That is, in contrast to the embodiments of FIGS. 2 and 3, the metal structure 113 of FIG. 4 may horizontally extend beyond the second region R2 into at least a portion of the first region RE Accordingly, the metal structure 113 of FIG. 4 may have a second width W2 greater than the first width W1 of FIG. 1.

Further, in this regard, the second region R2 may include a region overlapping with at least one of the first semiconductor chip 200 and the second semiconductor chip 300. Accordingly, the metal structure 113 may extend across some portion of the region including the circuit layer 110 and under the second semiconductor chip 300.

Figure 5:
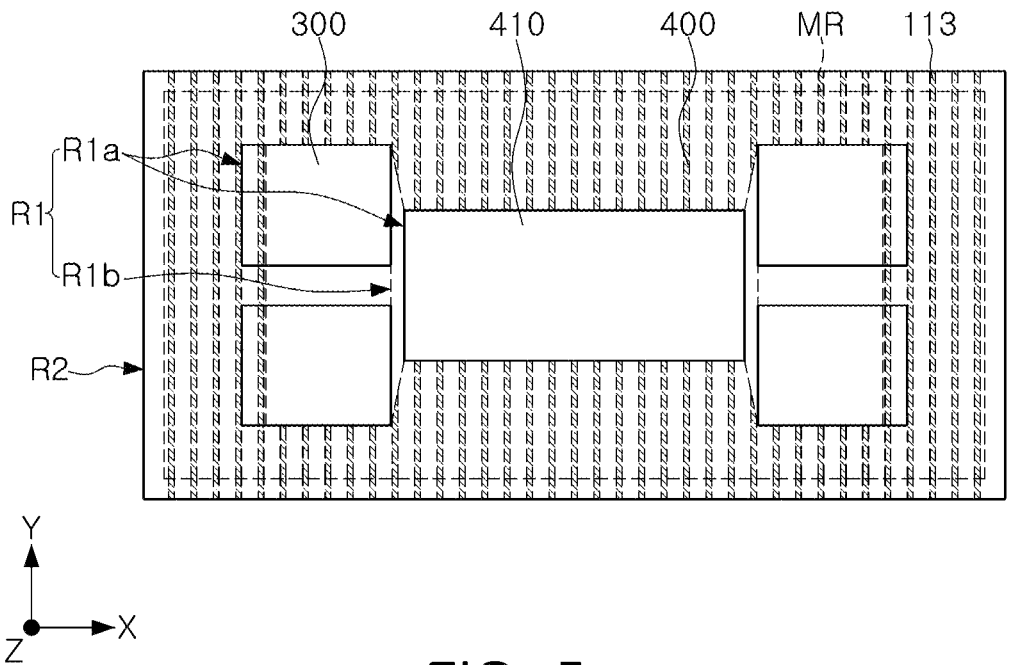
FIGS. 5, 6 and 7 are respective plan views illustrating semiconductor devices according to embodiments of the inventive concept.

FIG. 5 is a plan view illustrating a semiconductor device 1000d according to an embodiment of the inventive concept.

Referring to FIG. 5, the semiconductor device 1000d may be substantially similar to the semiconductor 1000 of FIG. 1, except for the particular structure of a metal structure 113.

In the semiconductor device 1000d, the metal structure 113 may include a second metal line pattern including a number of relatively long metal lines regularly spaced apart in the first horizontal (or X) direction and horizontally extending in the second horizontal (or Y) direction from opposing edge regions of the interposer 100. Here again, in contrast to the embodiments of FIGS. 2 and 3, the metal structure 113 of FIG. 5 may horizontally extends beyond the second region R2 into the first region R1 of the circuit layer 110. Accordingly, the metal structure 113 of FIG. 5 may have a width greater than the first width W1 of FIG. 1.

Figure 6:
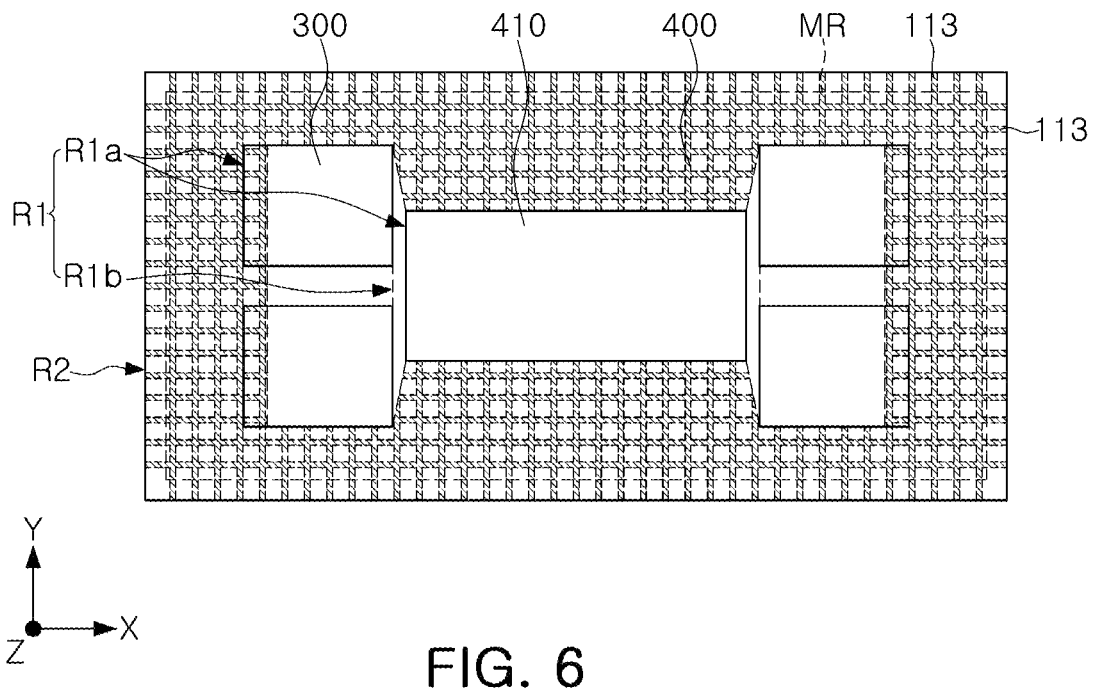

FIG. 6 is a plan view illustrating a semiconductor device 1000e according to an embodiment of the inventive concept.

Referring to FIG. 6, the semiconductor device 1000e may be substantially similar to the semiconductor 1000 of FIG. 1, except for the particular structure of a metal structure 113.

Here, the metal structure 113 of FIG. 6 may have a mesh structure including a first line pattern being regularly spaced apart in the second horizontal (or Y) direction, and horizontally extending in the first horizontal (or X) direction from opposing edge regions, and a second line pattern being regularly spaced apart in the first horizontal (or X) direction, and horizontally extending in the second horizontal (or Y) direction from opposing edge regions. Thus, the embodiment of FIG. 6 may be understood as a combination of the embodiments of FIGS. 4 and 5.

Figure 7:
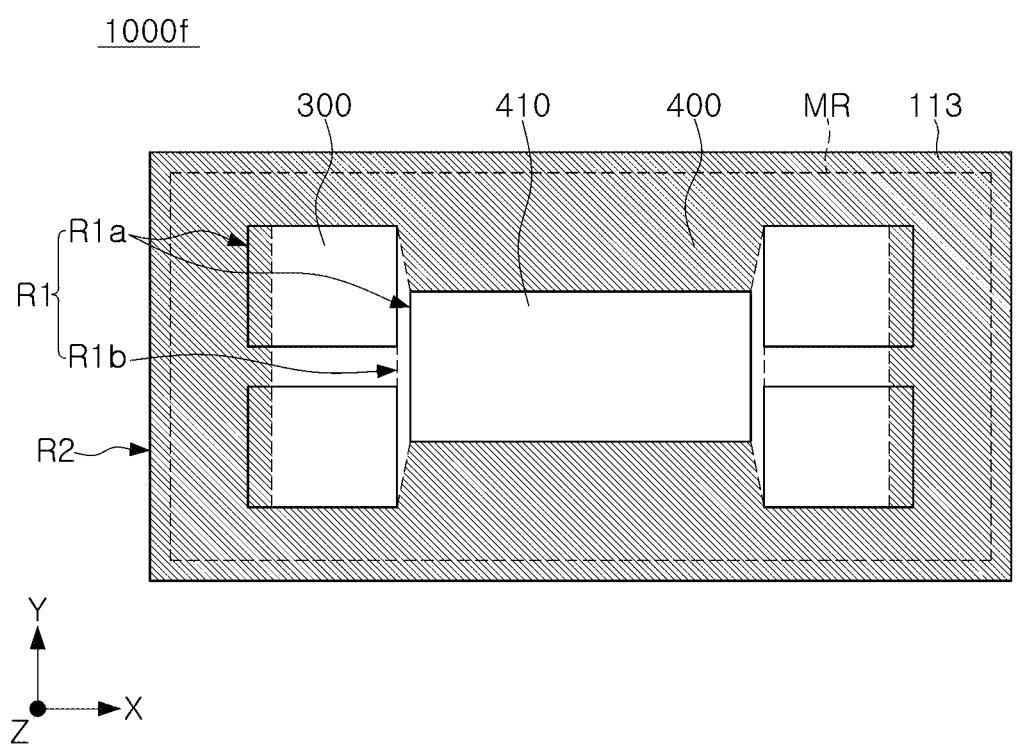

FIG. 7 is a plan view illustrating a semiconductor device 1000f according to an embodiment of the inventive concept.

Referring to FIG. 7, the semiconductor device 1000f may be substantially similar to the semiconductor 1000 of FIG. 1, except for the particular structure of the metal structure 113.

Here, in the semiconductor device 1000f, the metal structure 113 may have a plate structure (in contrast to the foregoing line structures or mesh structure), wherein the plate structure extends from at least one edge region (e.g., a portion of the second region R2 surrounding the first region R1) of the interposer 100 into the first region R1.

Referring to the illustrated embodiments of FIGS. 2, 3, 4, 5, 6 and 7, as the shape and/or configuration of the metal structure 113 effectively increases the corresponding dummy region, manufacturing yield for processes (e.g., chip on wafer (or CoW processes)) associated with the molded interposer (MIP) may be improved.

Figure 8A:
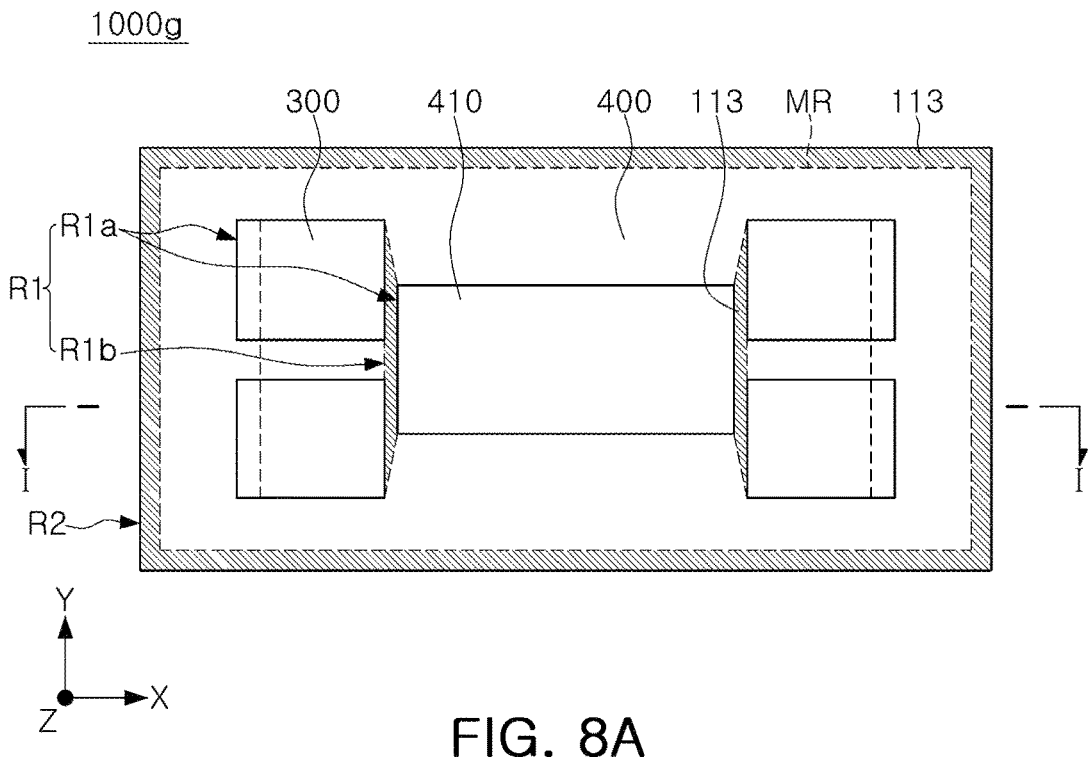
FIG. 8A is a plan view illustrating a semiconductor device according to embodiments of the inventive concept.
Figure 8B:
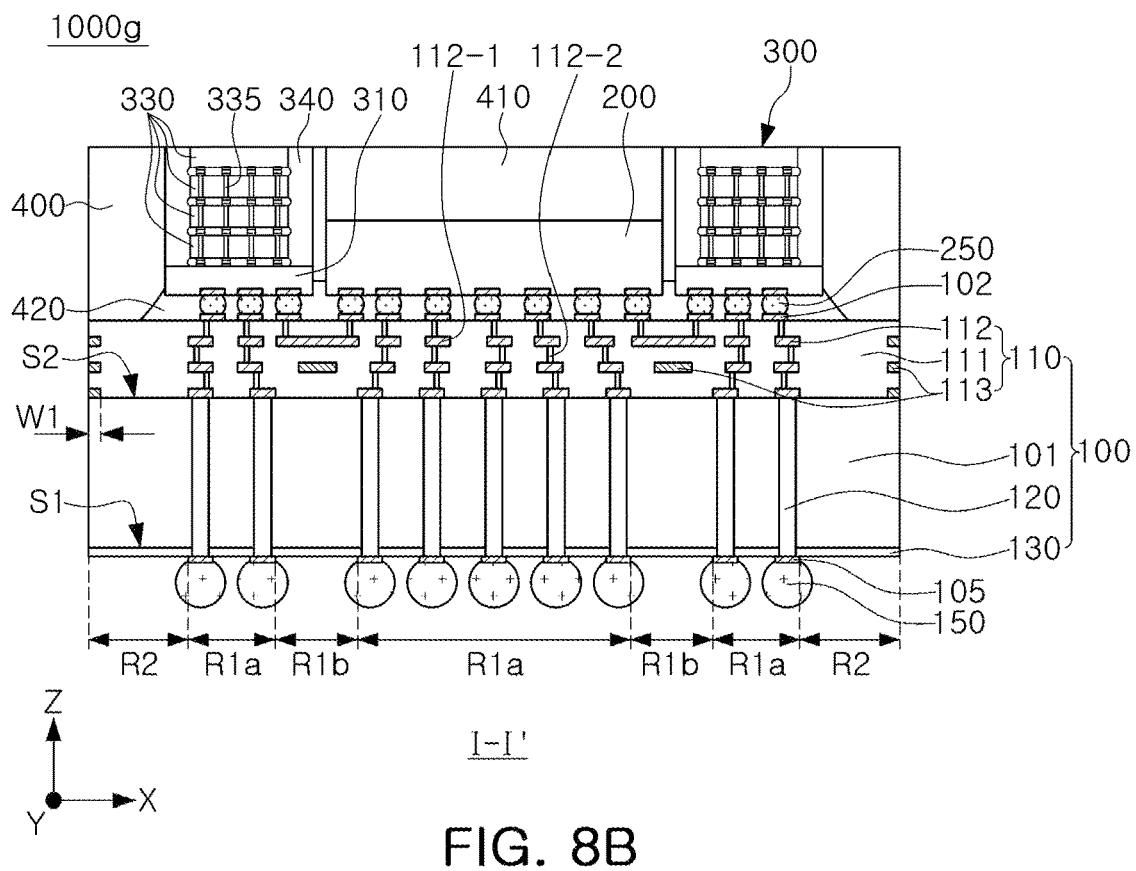
FIG. 8B is a cross-sectional view taken along line I-I' of FIG. 8A.

FIG. 8 includes FIGS. 8A an d8B, wherein FIG. 8A is a plan view illustrating a semiconductor device 1000g according to an example embodiment, and FIG. 8B is a cross-sectional view taken along line I-I' of FIG. 8A.

Referring to FIGS. 8A and 8B, the semiconductor device 1000g may be substantially similar to the semiconductor device 100 of FIG. 1, except for the particular structure of the metal structure 113.

In the semiconductor device 1000g, the metal structure 113 may be disposed in the second region R2 of the circuit layer 110 and a portion of the first region R1 of the circuit layer; namely a signal region R1b. In some embodiments, the signal region R1b of the first region R1 may be a region extending from an inner edge of the second semiconductor chip 300 to an outer edge of the first semiconductor chip 200. That is, the signal region R1b may be a region including portions of the second wiring structure 112 interconnecting the first semiconductor chip 200 with the one or more second semiconductor chips 300. (Here, however, the metal structure 113 may be electrically separated from a second wiring structure 112 disposed in the signal region R1b).

Accordingly, the metal structure 113 may be disposed in the signal region R1b within the various embodiments previously described in relation to FIGS. 1, 2, 3, 4, 5, 6, and 7. Although the signal region R1b of FIG. 8A has a trapezoidal shape, this need not always be the case and the shape of the signal region R1b may vary by design.

In this regard, in some embodiments, the second wiring structure 112 may include wiring patterns 112-1 laterally disposed and vertically spaced apart with in the insulating member 111. The metal structure 113 may be disposed at same level(s) as at least some of the lateral wiring patterns 112-1 (e.g., ground patterns) in the signal region R1b. However, the metal structure 113 may be electrically separated from the wiring patterns 112-1 in the ground layer of the signal region R1b. That is, the metal structure 113 may be formed in the signal region R1b, without interfering with signal pattern(s) between the first semiconductor chip 200 and the second semiconductor chip 300.

Accordingly, by increasing a proportion of the metal structure 113 within a semiconductor device according to embodiments of the inventive concept, process efficiency associated with MIP manufacturing as well as CoW bonding may be improved.

FIG. 9 is a cross-sectional view illustrating a semiconductor device 1000h according to an embodiment of the inventive concept.

Referring to FIG. 9, the semiconductor device 1000h may be substantially similar to the semiconductor device 1000 of FIG. 1, except that the semiconductor device 1000h further includes a package substrate 10 disposed on a lower surface of an interposer 100, wherein a first wiring structure 14 electrically connects at least one lower pad 105. Here, for purposes of description, it is assumed that the second semiconductor chip 300 is a HBM including vertically stacked memory chips.

The package substrate 10 may include a substrate body 11, lower pads 12 and upper pads 13 respectively disposed on lower and upper surfaces of the substrate body 11, and a first wiring structure 14 electrically connecting the pads 12 and 13. The package substrate 10 is a support substrate on which an interposer 100, a first semiconductor chip 200, and a second semiconductor chip 300 are mounted, and may be a substrate for a semiconductor package including a PCB, a ceramic substrate, a glass substrate, a tape wiring substrate, and the like. The substrate body 11 may include different materials depending on the type of the substrates. For example, when the package substrate 10 is a printed circuit board, it may be in a form in which a wiring layer is additionally laminated on one side or both sides of a body copper clad laminate or a copper clad laminate. Solder resist layers may be respectively formed on the lower surface and/or upper surface of the package substrate 10. The pads 12 and 13 and the first wiring structure 14 may form an electrical path connecting the lower surface and the upper surface of the package substrate 10. The first wiring structure 14 may include multi-layered redistribution layers and vias connecting the same. A first connection bump 15 connected to the pads 12 may be disposed on the lower surface of the package substrate 10. A second connection bump 150 connected to the pads 13 may be disposed on the upper surface of the package substrate 10. The first and second connection bumps 15 and 150 may include at least one of, for example, tin (Sn), indium (In), bismuth (Bi), antimony (Sb), copper (Cu), silver (Ag), zinc (Zn) and lead (Pb). For example, the first and second connection bumps 15 and 150 may have a spherical or ball shape including an alloy including tin (e.g., Sn—Ag—Cu). A space between the package substrate 10 and the interposer 100 may be filled by a lower underfill resin 40. The lower underfill resin 40 may extend to an edge of the interposer 100 to cover a portion of a side surface of the interposer 100. The lower underfill resin 40 may include an insulating polymer material, for example, an epoxy resin.

Figure 10:
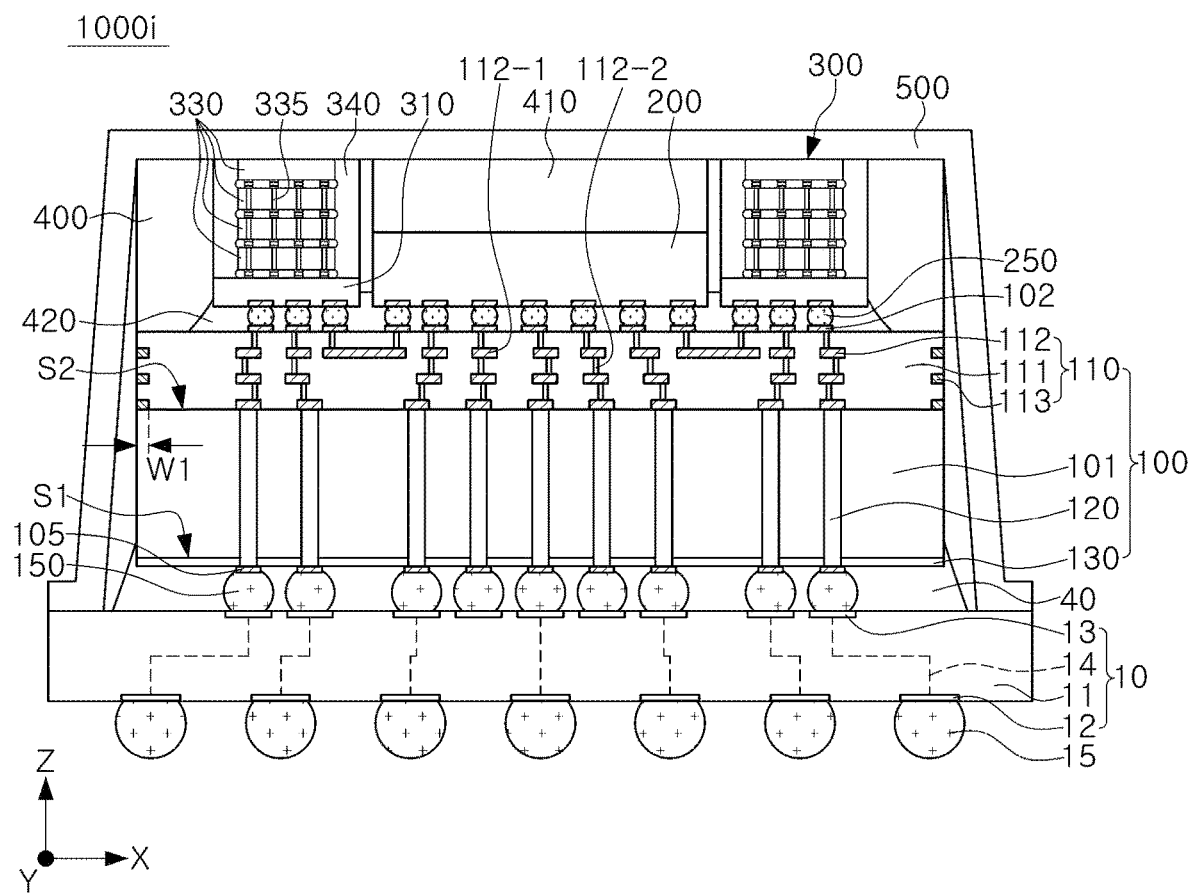

FIG. 10 is a plan view illustrating a semiconductor device 1000*i* according to an embodiment of the inventive concept.

Referring to FIG. 10, the semiconductor device 1000*i* may be substantially similar to the semiconductor device 1000*h* of FIG. 9, except that the semiconductor device 1000*i* further includes a heat dissipation structure 500 disposed on the package substrate 10 and covering the first semiconductor chip 200 and the second semiconductor chip 300.

The heat dissipation structure 500 may control warpage of the semiconductor device 1000*i*, and radiate heat generated in the first semiconductor chip 200 and the second semiconductor chip 300 externally. The heat dissipation structure 500 may have a shape completely covering the first semiconductor chip 200, the second semiconductor chip 300, and the interposer 100, but is not limited thereto. For example, the heat dissipation structure 500 may have a plate shape covering only upper surfaces of the first semiconductor chip 200 and the second semiconductor chip 300. The heat dissipation structure 500 may include one or more material (s) exhibiting excellent thermal conductivity, such as, for example, aluminum (Al), gold (Au), silver (Ag), copper (Cu), iron (Fe), graphite, graphene, etc. An adhesive member 410 may be interposed between the heat dissipation structure 500 and the first semiconductor chip 200.

FIG. 11 includes FIGS. 11A to 11H which are related cross-sectional views illustrating a method of manufacturing the semiconductor device 100 of FIG. 1.

Figure 11A:
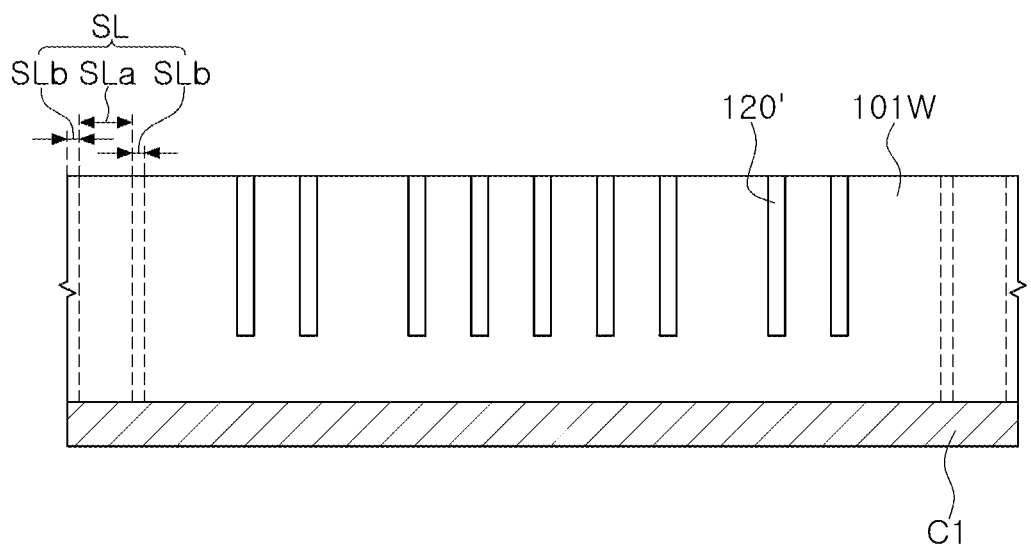
FIG. 11, includes FIGS. 11A, 11B, 11C, 11D, 11E, 11F, 11G and 11H (hereafter collectively, "FIGS. 11A to 11F") which are related cross-sectional views illustrating a method of manufacturing the semiconductor device of FIG. 1.

Referring to FIG. 11A, a semiconductor wafer may be attached to a first carrier C1, and a through-via 120' extending into a base substrate 101W may be formed. The semiconductor wafer may include base substrates 101W separated by a scribed lane region SL. The through-via 120' may extend inwardly from a second surface S2 of the base substrate 101W. The through-via 120' may be formed to have a pillar shape to fill a via hole, and may include a barrier film formed on a surface of the pillar shape and a buried conductive layer filling an inside of the barrier film. The through-via 120' may be formed using an etching process for forming a via hole and an oxidation process, a plating process, a planarization process, and the like for forming a barrier film and a buried conductive layer in the via hole.

Figure 11B:
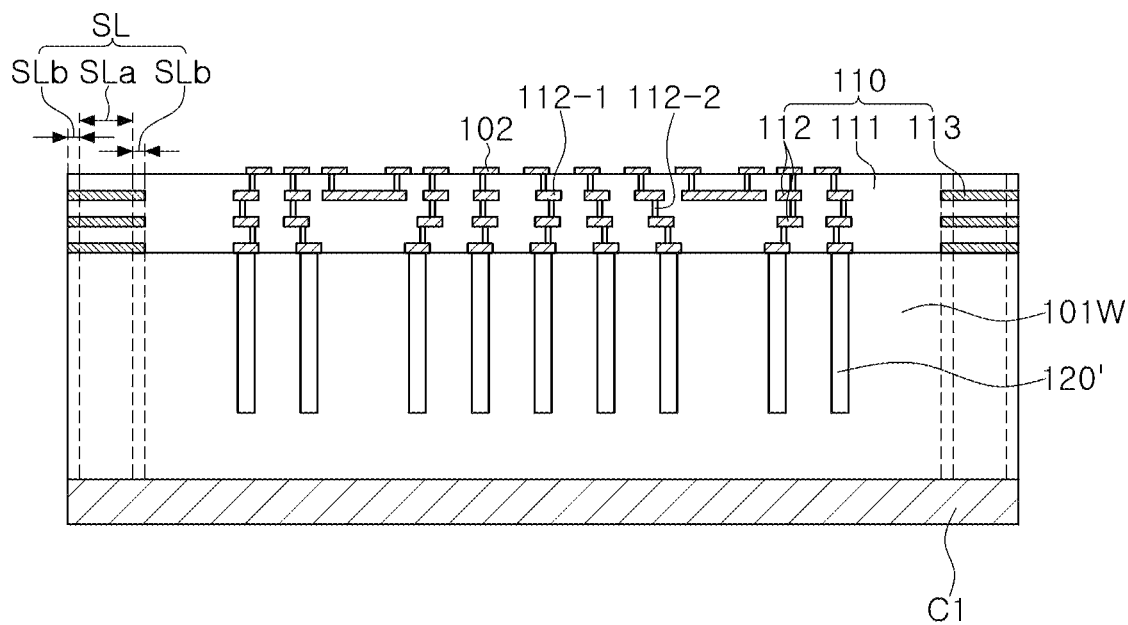

Referring to FIG. 11B, a circuit layer 110 may be formed on the base substrates 101W. The circuit layer 110 may include an insulating member 111, a second wiring structure 112, and a metal structure 113. The insulating member 111 and the second wiring structure 112 may be formed by repeatedly performing an oxidation process, a photolithography process, an etching process, a plating process, and the like. The metal structure 113 may be formed together when a photolithography process and an etching process are performed on wiring patterns 112-1 of the second wiring structure 112 in the above process. However, the metal structure 113 may be formed to be electrically separated from the wiring patterns 112-1. Here, a semiconductor device according to embodiments such as those illustrated in FIGS. 2, 3, 5, 6, 7 and 8 may be formed by forming the metal structure 113 by changing a pattern mask in the photolithography process and the etching process, and then performing the process of FIGS. 11C to 11H in the same manner. An upper pad 102 may be formed on the circuit layer 110 through a photolithography process, an etching process, or the like.

Figure 11C:
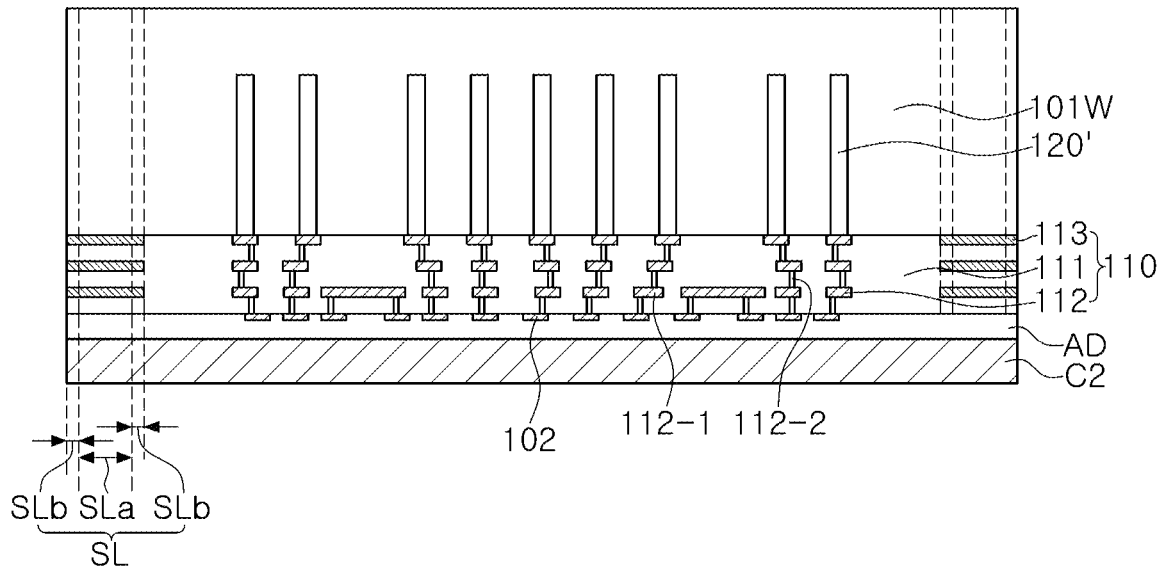

Referring to FIG. 11C, the wafer (or base substrates 101W) of FIG. 11B may be inverted and attached to a second carrier C2. An adhesive layer AD may be disposed on a surface of the second carrier C2, and the upper pad 102 on the circuit layer 110 may be buried in the adhesive layer AD. In this case, an upper portion of the through-via 120' may be buried in the base substrate 101W, but in a subsequent process (FIGS. 11D and 11E), a portion of the through-via 120' may be exposed to be connected to a lower pad 105.

Figure 11D:
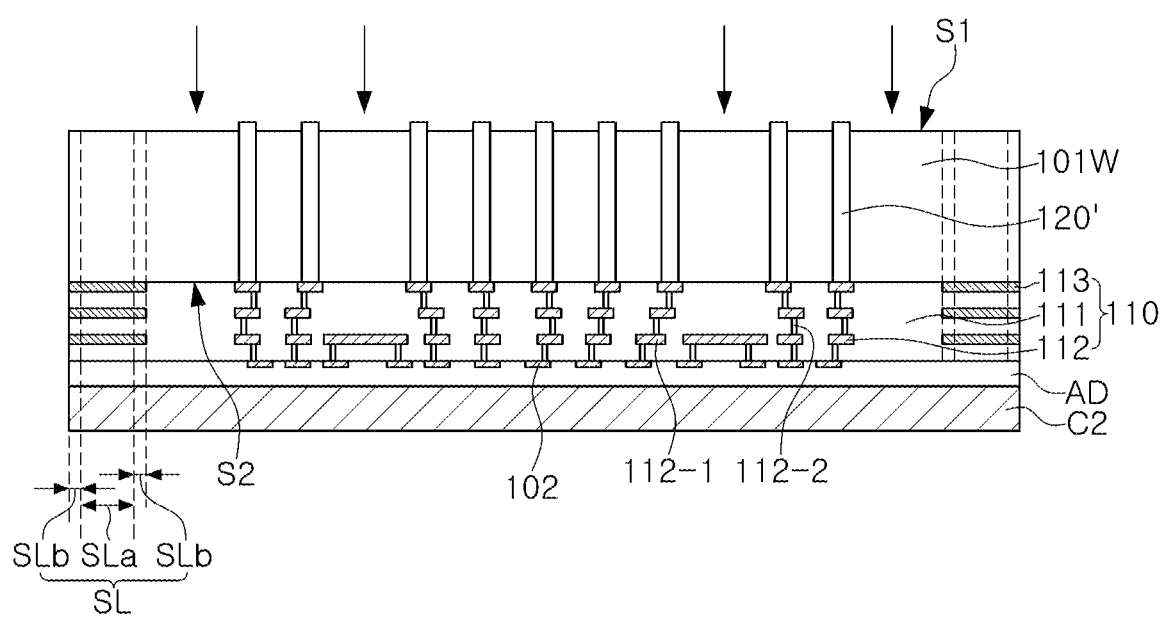

Referring to FIG. 11D, a portion of the base substrate 101W may be removed to form a first surface S1 exposing a portion of the through-via 120'. In one example, a portion of the base substrate 101W may be removed so that a portion of the through-via 120' protrudes onto the first surface S1. Accordingly, the through-via 120' may have a shape that completely penetrates through the base substrate 101W. A portion of the base substrate 101W may be removed by a chemical mechanical polishing (CMP) process, an etch-back process, or a combination thereof.

Figure 11E:
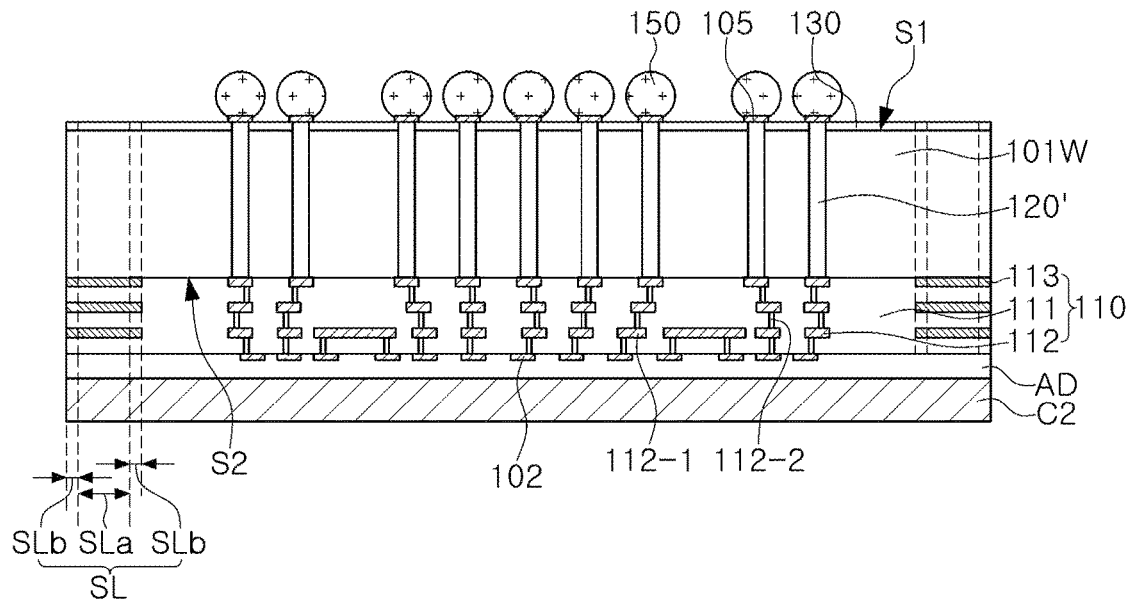

Referring to FIG. 11E, a protective layer 130 and a lower pad 105 may be formed on a first surface S1 of the base substrate 101W. The protective layer 130 may be formed by forming an insulating polymer film covering the first surface S1 of the base substrate 100W, and then partially removing the insulating polymer film such that the through-via 120 is exposed. The lower pad 105 may be formed using a photolithography process, a plating process, or the like. The insulating polymer film may be formed by, for example, a spin coating process or a spray process. The lower pad 105 may be formed to contact the through-via 120 exposed from the protective layer 130. A second connection bump 150 may be formed on the lower pad 105

Figure 11F:
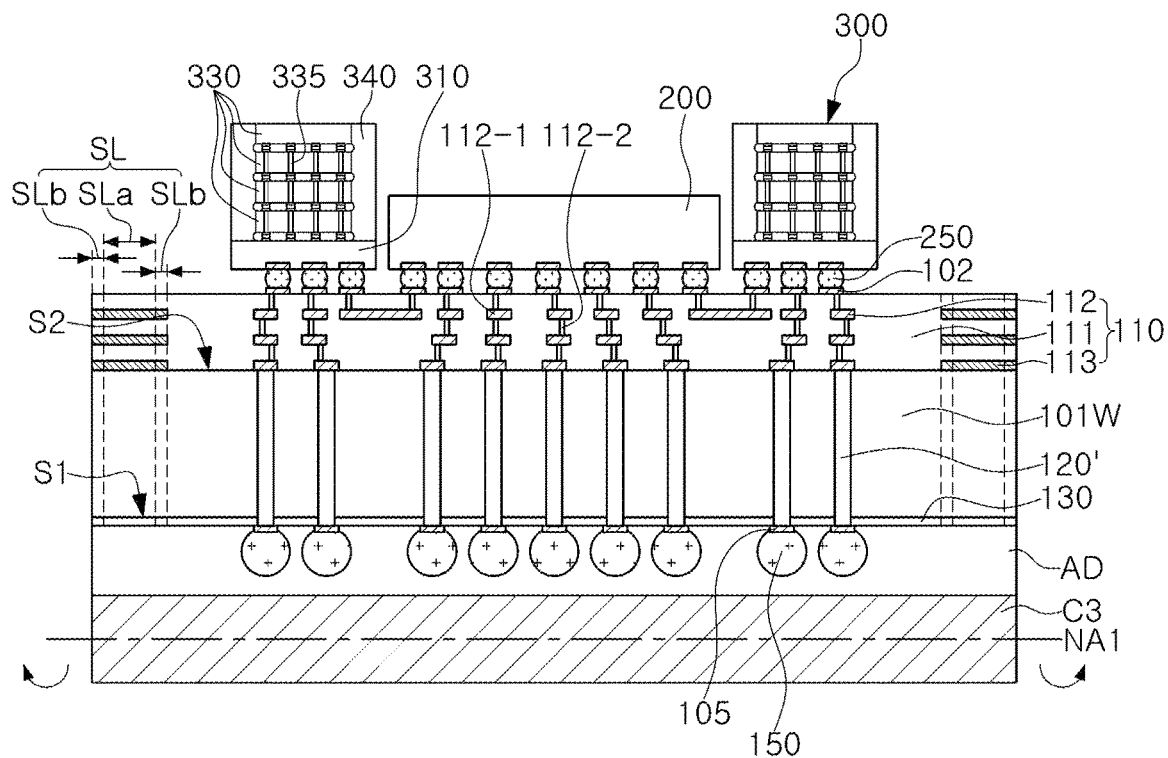

Referring to FIG. 11F, the wafer (or the base substrates 101W) of FIG. 11E may be inverted and attached to a third carrier C3. A third connection bump 250 may be formed on an upper pad 102. The first semiconductor chip 200 and the second semiconductor chip 300 may be formed on the third connection bump 250. In a process of mounting the first semiconductor chip 200 and the second semiconductor chip 300, due to a difference in a coefficient of thermal expansion (CTE) between an upper side and a lower side with respect to a first neutral axis NA1, smile force may be generated in the third carrier portion C3, which is a lower side of the first neutral axis NA1. Accordingly, warpage may occur in the base substrate 101W. However, by disposing a metal structure 113 having a high coefficient of thermal expansion (CTE) in the circuit layer region 110, which is the upper side of the first neutral axis NA1, the smile force can be offset and the warpage of the base substrate 101W may be suppressed.

Figure 11G:
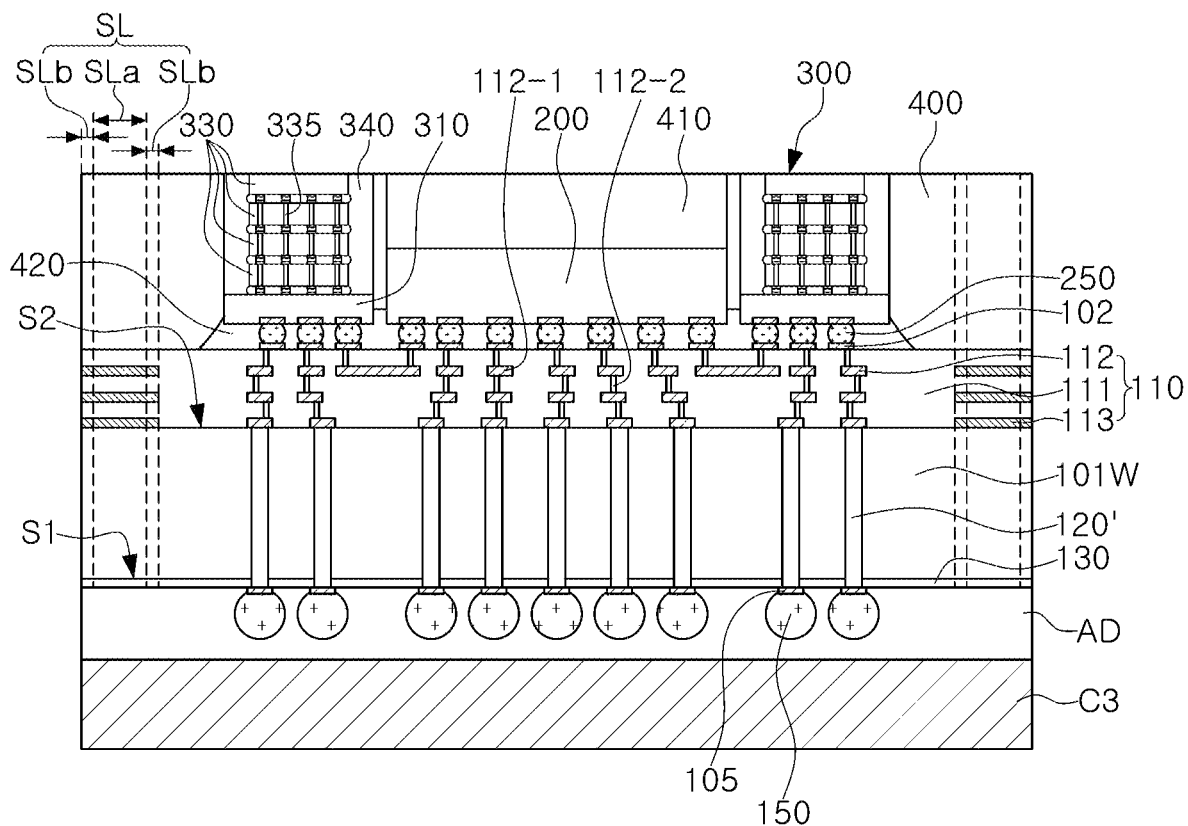

Referring to FIG. 11G, a space between the circuit layer 110 and the first semiconductor chip 200 and between the circuit layer 110 and the second semiconductor chip 300 may be filled with an upper underfill resin 420, and an adhesive member 410 may be formed on an upper surface of the first semiconductor chip 200. A mold layer 400 may be formed to cover the first semiconductor chip 200, the second semiconductor chip 300, and the upper underfill resin 420.

Figure 11H:
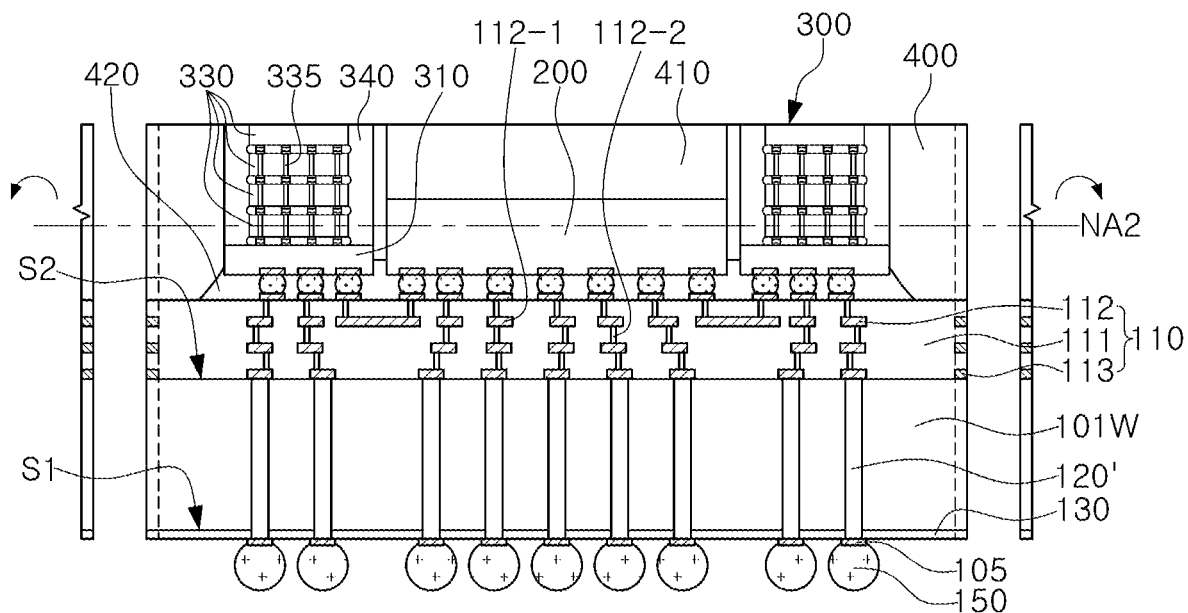

Referring to FIG. 11H, substrates in a wafer state may be separated into a singulated substrates by cutting the base substrate 101W of FIG. 8E along a touch region SLa among the scribe lane regions SL. Accordingly, a semiconductor device including a metal structure 113 in a non-touch region SLb may be formed. However, depending on an order of a manufacturing process, the circuit layer 110 may be disposed on a lower surface of the base substrate 101. In a semiconductor device formed by the manufacturing method, a process of being mounted on the package substrate 10 may be additionally performed subsequently. In the subsequent process, warpage of the semiconductor device may occur due to a difference in coefficients of thermal expansion occurring on an upper side and a lower side with respect to a second neutral axis NA2. In general, since the coefficient of thermal expansion of the upper side of the second neutral axis NA2 is high, cry force may act. However, in the semiconductor device, the cry force may be offset by disposing a metal structure 113 having a high coefficient of thermal expansion on the lower side of the second neutral axis NA2. Accordingly, the warpage of the semiconductor device can be suppressed.

In addition, since the metal structure 113 is disposed in an edge region of the circuit layer, it is possible to suppress the progress of cracks in subsequent processes and a final structure.

As set forth above, according to example embodiments of the inventive concept, by disposing a metal structure in a region including a scribe lane region, a semiconductor device having improved reliability may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The term "connect" in relation to different elements or components denotes a direct connection or an indirect connection through an intervening material/element or layer (e.g., an adhesive layer).

While example embodiments have been shown and described above, it will be apparent to those skilled in the art that modifications and variations could be made without departing from the scope of the inventive concept as defined by the appended claims.

What is claimed is:

1. A semiconductor device, comprising:
   an interposer extending in a first horizontal direction and a second horizontal direction, wherein the interposer includes a base substrate including a first surface and a second surface opposing the first surface, and a circuit layer disposed on the second surface and including a first region and a second region surrounding the first region, and the circuit layer includes an insulating member, a wiring structure disposed in the first region of the circuit layer within the insulating member, and a metal structure disposed in the second region of the circuit layer within the insulating member;
   a first semiconductor chip centrally mounted on the interposer and connected to the wiring structure; and
   at least one second semiconductor chip mounted on the interposer adjacent to the first semiconductor chip and connected to the wiring structure.

2. The semiconductor device of claim 1, wherein the metal structure includes metal segments regularly spaced apart in the first horizontal direction and horizontally extending in the second horizontal direction from opposing edge regions of the interposer within only the second region of the circuit layer.

3. The semiconductor device of claim 1, wherein the metal structure includes metal segments regularly spaced apart in the second horizontal direction and horizontally extending in the first horizontal direction from opposing edge regions of the interposer within only the second region of the circuit layer.

4. The semiconductor device of claim 1, wherein the metal structure includes a first metal line pattern of metal lines regularly spaced apart in the second horizontal direction and horizontally extending in the first horizontal from opposing edge regions of the interposer within the second region of the circuit layer and at least a portion of the first region of the circuit layer.

5. The semiconductor device of claim 1, wherein the metal structure includes a second metal line pattern of metal lines regularly spaced apart in the first horizontal direction and horizontally extending in the second horizontal from opposing edge regions of the interposer within the second region of the circuit layer and at least a portion of the first region of the circuit layer.

6. The semiconductor device of claim 1, wherein the metal structure is a metal mesh including:
   a first metal line pattern of metal lines regularly spaced apart in the second horizontal direction and horizontally extending in the first horizontal from opposing edge regions of the interposer within the second region of the circuit layer and at least a portion of the first region of the circuit layer; and
   a second metal line pattern of metal lines regularly spaced apart in the first horizontal direction and horizontally extending in the second horizontal from opposing edge regions of the interposer within the second region of the circuit layer and at least a portion of the first region of the circuit layer.

7. The semiconductor device of claim 1, wherein the metal structure is a plate structure extending from all edge regions of the interposer within the second region of the circuit layer and at least partially into the first region of the circuit layer.

8. The semiconductor device of claim 1, wherein the metal structure is further disposed in a signal region of the first region of the circuit layer, and
   the signal region includes portions of the wiring structure interconnecting the first semiconductor chip with the at least one second semiconductor chip.

9. The semiconductor device of claim 1, wherein the wiring structure includes wiring patterns having a first thickness, and the metal structure includes metal patterns having a second thickness equal to the first thickness.

10. The semiconductor device of claim 1, wherein the metal structure is electrically separated from the wiring structure.

11. The semiconductor device of claim 1, wherein the interposer comprises:
   a rectangular main region encompassing at least the first region; and
   respective non-touch regions bordering respective edges of the main region,
   wherein each of the non-touch regions is a remaining portion of a scribe lane region, and the second region of the circuit layer encompasses the non-touch regions.

12. The semiconductor device of claim 11, wherein each of the non-touch regions has a width ranging from 125 μm to 165 μm.

13. The semiconductor device of claim 1, wherein the second region includes an overlapping region that overlaps at least a portion of at least one of the first semiconductor chip and the second semiconductor chip, and
   the metal structure extends from the second region into the overlapping region.

14. The semiconductor device of claim 1, further comprising:
   upper pads disposed on an upper surface of the circuit layer and connected to the wiring structure;
   lower pads disposed on a lower surface of the interposer; and
   through vias respectively connecting an upper pad among the upper pads with a lower pad among the lower pads.

15. The semiconductor device of claim 14, further comprising:
   second connection bumps disposed on the lower pads; and
   a package substrate mounting the interposer through the second connection bumps, wherein the package substrate includes a first wiring structure connecting at least one of the lower pads.

16. The semiconductor device of claim 1, further comprising:
   a heat dissipation structure disposed on the first semiconductor chip and the at least one second semiconductor chip through an adhesive member.

17. A semiconductor device, comprising:
   an interposer including a central region and an edge region entirely surrounding the central region, wherein the interposer includes a wiring structure disposed in the central region and a metal structure disposed continuously within the edge region;
   a first semiconductor chip mounted in the central region and connected to the wiring structure; and
   a second semiconductor chip mounted in the central region adjacent to the first semiconductor chip and connected to the wiring structure,
   wherein the wiring structure and the metal structure are electrically separate and are respectively formed from the same material.

18. The semiconductor of claim 17, wherein the interposer comprises:
   a base substrate;
   a circuit layer disposed on the based substrate and including the wiring structure;
   upper pads disposed on an upper surface of the circuit layer and connected to the wiring structure;
   lower pads disposed on a lower surface of the interposer; and
   through vias respectively connecting an upper pad among the upper pads with a lower pad among the lower pads.

19. A semiconductor device, comprising:
   a package substrate including a substrate body having an upper surface and a lower surface, upper pads disposed on the upper surface, lower pads disposed on the lower surface, first connection bumps respectively disposed the lower pads, and a first wiring structure connecting at least one upper pad with at least one lower pad;
   an interposer mounted on the package substrate through second connection bumps respectively disposed on the upper pads and including a second wiring structure;
   a logic chip centrally mounted on the interposer and connected to the second wiring structure; and
   a memory chip mounted on the interposer adjacent to the logic chip and connected to the second wiring structure,
   wherein the interposer includes a base substrate, and a circuit layer disposed on base substrate,
   the interposer further includes a first region and a second region surrounding the first region, and
   the circuit layer includes an insulating member, the second wiring structure disposed in the first region of the circuit layer within the insulating member, and a metal structure disposed in the second region of the circuit layer within the insulating member.

20. The semiconductor device of claim 19, wherein the interposer further includes a rectangular main region encompassing at least the first region, and respective non-touch regions bordering respective edges of the main region,
   each of the non-touch regions is a remaining portion of a scribe lane region and has a width ranging from 125 μm to 165 μm, and
   the second region of the circuit layer encompasses the non-touch regions.

* * * * *